United States Patent [19]

Wassink

[11] 4,378,604
[45] Mar. 29, 1983

[54] RECEIVER HAVING A SEARCH TUNING CIRCUIT

[75] Inventor: Derk J. C. Wassink, Eindhoven, Netherlands

[73] Assignee: U.S. Philips Corporation, New York, N.Y.

[21] Appl. No.: 227,039

[22] Filed: Jan. 21, 1981

[30] Foreign Application Priority Data

Jan. 28, 1980 [NL] Netherlands ........................ 8000509

[51] Int. Cl.³ .......................... H04B 1/26; H03J 7/28
[52] U.S. Cl. ...................................... 455/161; 455/165
[58] Field of Search ............... 455/161, 164, 165, 168, 455/169, 185; 358/193.1

[56] References Cited

U.S. PATENT DOCUMENTS

| 4,011,515 | 3/1977 | Hanson | 455/169 |
| 4,174,501 | 11/1979 | Chastagnier et al. | 455/161 |
| 4,285,066 | 8/1981 | Van Devrsen | 455/165 |

Primary Examiner—Marc E. Bookbinder
Attorney, Agent, or Firm—Thomas A. Briody; William J. Streeter; Edward W. Goodman

[57] ABSTRACT

In a receiver having a search tuning circuit with which a group of data (39 or 41) which corresponds to certain transmitters can be searched by means of a group selection switch (43, 45) a field strength behaviour-depending starting delay circuit (61) is used to delay the start of a search action relative to both decreases in field strength and the frequency of the decreases to prevent a too frequent start of a search action (FIG. 1).

2 Claims, 2 Drawing Figures

RECEIVER HAVING A SEARCH TUNING CIRCUIT

BACKGROUND OF THE INVENTION

The invention relates to a receiver having a search tuning circuit for, each time, tuning the receiver to a next tuning datum from a group of tuning data stored in a memory circuit, which search tuning circuit, under the influence of a starting signal which depends on the field strength of a received transmitter and is generated when the field strength of the received transmitter becomes too weak, can start a search action, the receiver further comprising a start-signal delay circuiit having an adjustable time delay for delaying the starting signal in dependence on the behavior of the field strength signal.

A receiver of the above-mentioned type is known from U.S. Pat. No. 4,174,501, issued Nov. 13, 1979. A search action of this receiver is started when the field strength of a transmitter to which the receiver has been tuned decreases to below a certain value. Particularly, when such a receiver is used in a vehicle it appears that depending on the speed of the vehicle, the search action is either started too frequently (namely at a low speed of the vehicle) or not frequently enough (namely at a high speed).

SUMMARY OF THE INVENTION

It is an object of the invention to prevent this.

According to the invention, a receiver of the type defined in the opening paragraph is characterized in that to adjust the time delay, the start-signal delay circuit is controlled by a control circuit which increases the time delay each time the field strength, within a fixed time interval after the preceding search action, was too low for a period of time at least equal to the adjusted time delay, and which reduces the adjusted time delay each time after the interval in which no increase of the time delay occurred.

DESCRIPTION OF THE DRAWINGS

The invention will now be further explained by way of example with reference to the accompanying drawings. In the drawings.

Figure 1:
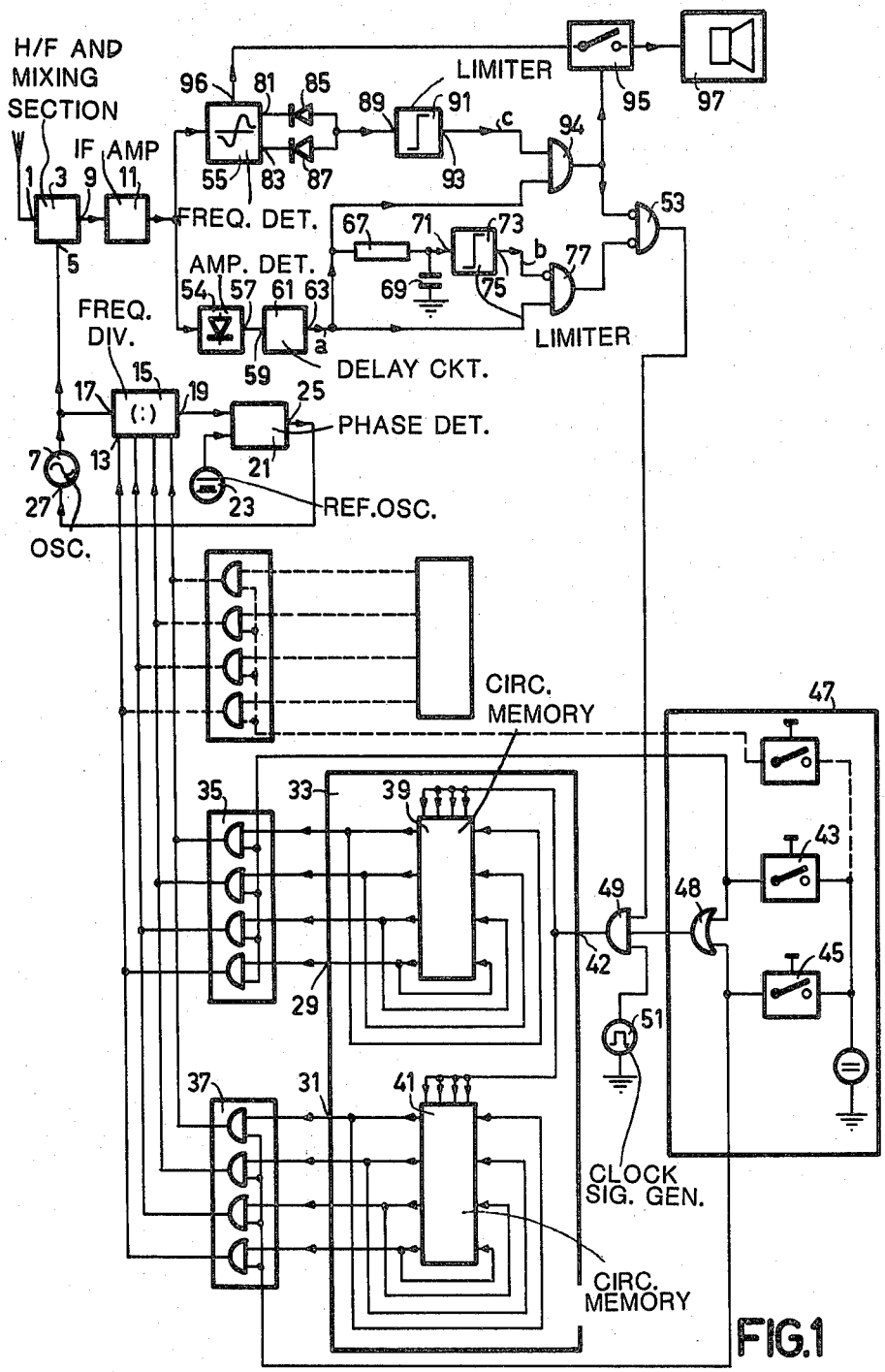
FIG. 1 illustrates a receiver according to the invention by means of a block schematic circuit diagram.

Details which are not important for an understanding of the invention have not been included in the drawings.

DESCRIPTION OF THE PREFERRED EMBODIMENT

In FIG. 1 an aerial signal is applied to an input 1 of a high-frequency and mixing section 3 of the receiver, and a signal originating from an oscillator 7 is applied to an input 5 thereof. An intermediate frequency signal, which is applied to an intermediate frequency amplifier 11, is obtained from an output 9 of the high-frequency and mixing section 3.

The oscillator 7 forms part of a frequency synthesizing circuit which is turned by applying, to an input combination 13 of a frequency divider 15, a tuning datum in the form of a digital code which adjusts the number by which the divider 15 divides the frequency of a signal which originates from the oscillator 7 and which is applied to an input 17. A signal, whose frequency is determined by the oscillator frequency and the number by which the divider 15 divides, is obtained from an output 19 of the frequency divider 15. This signal, is compared with a reference signal received from a reference oscillator 23, in a phase detector 21 which generates a control signal at a control signal output 25 thereof which is applied to a control signal input 27 of the oscillator 7 thereby adjusting the oscillator 7 output signal to a value which, when divided in divider 15, is equal in frequency and phase to that of the reference oscillator 23. This results in the receiver being tuned to a frequency determined by the tuning datum.

The tuning datum applied to the input combination 13 of the frequency divider 15 is received from output combination 29 or 31 of a memory circuit 33, which is connected to the input combination 13 of the frequency divider 15 via gate citcuits 35 and 37.

The memory circuit 33 comprises two circulating memories 39, 41, each containing a group of tuning data and which, in response to a clock pulse applied to an input 42, can each time offer a different tuning datum to each of the output combinations 29, 31. The tuning data in a group have, for example, been chosen so that they can tune the receiver to transmitters of the same character, such as, for example, transmitters transmitting the same program.

By means of the gate circuits 35, 37 it is possible to select from which circulating memory, 39 or 41, and consequently from which group the tuning data are to be applied to the frequency divider 15. This is done by means of a switching signal coming from a switch 43 or 45 of a control device 47, when the relevant switch is closed. An OR-gate 48 then ensures that an AND-gate 49 is supplied with this signal, so that clock pulses produced by a clock signal generator 51 are applied to the input 42 of the memory circuit 33 via this AND-gate 49 when a reception condition signal, which corresponds to a logic one, is applied to a third input of the AND-gate 49. This signal is produced by an AND-gate 53 having inverting inputs. A search action is started by the closure of one of the switches 43 or 45, causing the tuning data from a group to tune the receiver consecutively to frequencies which correspond with those tuning data. The search action is stopped when the reception condition signal coming from the AND-gate 53 becomes logic zero.

There now follows a description of how the reception condition signal at the output of the AND-gate 53 is produced. On receipt of a transmitter signal, the intermediate frequency section 11 applies an intermediate frequency signal to an amplitude detector 54 and to a frequency detector 55. The amplitude detector 54 has an output 57, which applies a rectified intermediate frequency signal to an input 59 of a field strength behavior dependent delay circuit 61. This delay circuit 61 delays descending edges in the signal at the output 57 of the amplitude detector 54 but does not delay ascending edges. The delay in the descending edges depends on the behavior of the field strength and will be further explained hereinafter with reference to FIG. 2.

A logic signal, which will be denoted by a, is produced at an output 63 of the delay circuit 61. The signal a has a value logic one when the received transmitter signal has a sufficient field strength and is located within the bandwidth of the intermediate frequency amplifier 11. When the receiver is an FM-broadcast receiver, that bandwidth is large and the signal a becomes very rapidly logic one when such a transmitter signal is received.

The signal a at the output 63 of the delay circuit 61 is further applied to an input 71 of a limiter 73 via an integrating circuit formed by a resistor 67 and a capacitor 69. At an output 75, this limiter 73 supplies a logic signal denoted b, which is applied to an inverting input of an AND-gate 77, the signal a at the output 63 of the delay circuit 61 being applied to a non-inverting input of the AND-gate 77. This signal b is in its totality somewhat delayed with respect to the signal a.

The AND-gate 77 now produces a signal ab' which, because of the inversion at the input of the AND-gate 53, renders this AND-gate 53 non-conductive for a short period of time immediately after each occurrence of a positive edge in the a-signal, which causes the AND-gate 49 to be rendered non-conductive and a search action of the receiver to be stopped during that short period of time.

The frequency detector 55 has two outputs 81, 83 at which signals appear, from which unwanted alternating current components have been removed. Compared with a reference level, these signals are of the opposite polarity and have the known S-shape as a function of the frequency. Via two diodes 85, 87 these signals are applied to a limiter 91, which produces at an output 93 a logic signal denoted by c, which is logic one outside the pass region of the intermediate frequency amplifier 11 and in a very small frequency range around the intermediate frequency. This signal c and also the signal a are applied to an AND-gate 94.

The AND-gate 94 produces a logic signal ac which is applied to a further inverting input of the AND-gate 53 and to a switch 95 in a low frequency signal path of the receiver, which leads from an output 96 of the frequency detector 55 to a reproduction device 97.

The logic signal ac produced by the AND-gate 94 becomes logic one when a transmitter which is received during the search action which was temporarily stopped by the signal ab', has the proper frequency and it forms a definite stop signal as then the AND-gate 53 and, consequently, the AND-gate 49 remain non-conductive. The sound channel is then through-connected by the switch 95. When the received transmitter does not have the proper frequency then the signal ac remains logic zero and the search action is immediately restarted after the signal ab' has become logic zero.

The AND-gate 53 produces a logic signal (ac)'.(ab')'=a'+bc', which is the reception condition signal which causes a search tuning action to be stopped at a received transmitter of a sufficient field strength and a proper frequency as described in the foregoing. This is initiated by the undelayed, positively going edge of the a signal.

Restarting a search action when the field strength decreases to below a certain value is caused by a negatively going edge of the a signal, which passes from logic one to logic zero. The output signal a'+bc' of the AND-gate 53 then becomes one and, as one of the switches 43, 45 is still closed, clock pulses which cause a search action to be performed are passed via the AND-gate 49. As mentioned in the foregoing, the descending edges in the a signal are delayed with respect to the instants at which the field strength of the received transmitter signal decreases to below a certain value. This can be realised by means of the circuit 61, which will be described hereinafter.

It will be clear that the receiver, if so desired, may further also be suitable for tuning to tuning data other than those obtained from the memory circuit 33. This is indicated in the Figure by means of broken lines.

Although the receiver of the embodiment has been provided with a frequency synthesizing circuit having a variable divider, a different type of frequency synthesizing circuit may of course alternatively be used.

Several functions in the receiver which can be carried out simultaneously in the given example may of course also be carried out sequentially, for example when the receiver includes a microprocessor.

Although the described search tuning circuit is particularly suitable for FM radio-broadcast receivers and in particular for vehicle receivers, the field of application need not be limited thereto; also in aircraft receivers, for example, an improvement may be obtained with this search tuning circuit.

It will further be obvious that several other combinations of gates, detection circuits and limiters are possible to perform the functions according to the invention. The reception condition signal or the composite portions thereof may, for example, alternatively be combined with the other signals which are applied to the AND-gate 49 and to the OR-gate 48.

Any type of detector which can determine a frequency datum accurately without bandwidth limiting means may be used as the frequency detector.

If so desired, the memory circuit of the receiver may contain one or more groups of tuning data.

For the use of the field strength behavior depending delay 61 in the starting signal, the described temporary stopping action and restarting on receipt of a transmitter having an unwanted frequency are not a requirement and may be omitted, in which case only an inverse of the signal a may, if so desired, be used as the reception condition signal.

It is further possible to process the descending and ascending edges in the a signal in separate circuits and to apply them as individual starting and stopping signals to a start-stop memory which can produce the reception condition signal.

Figure 2:
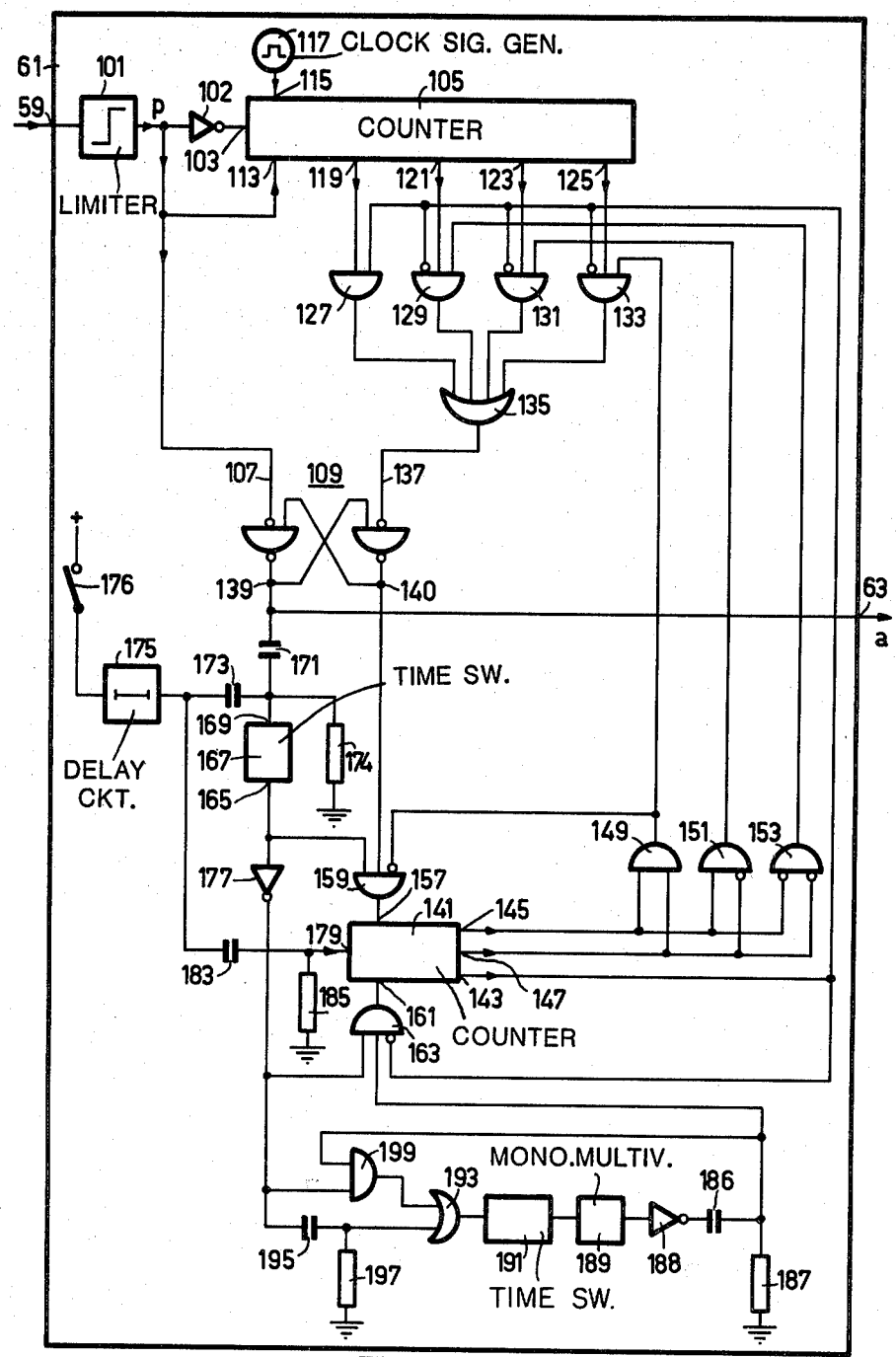
FIG. 2 illustrates, also by means of a block schematic circuit diagram, a possible circuit for a receiver according to the invention by means of which a signal delay which depends on the behavior of the field strength can be obtained.

In FIG. 2 corresponding elements have been given the same reference numerals as in FIG. 1. The field strength-dependent signal, which is converted by a limiter 101 into a logic signal p which is logic one at a sufficient field strength for a good reception and logic zero when the field strength is insufficient, is applied to the input 59 of the delay circuit 61.

The logic signal p is applied via an inverter 102 to a command input 103 of a first counter 105 and directly to a setting input 107 of a flipflop 109 and to a resetting input 113 of the first counter 105. Clock pulses produced by a clock signal generator 117 are applied to an input 115 of the first counter 105, which has four outputs 119, 121, 123, 125.

When the logic signal p is one, the first counter 105 is kept in the reset condition via the input 113 and the inverted p signal blocks a counting operation at the command input 103. Each one of the outputs 119, 121, 123, 125 is then zero. These outputs are connected, respectively, to inputs of AND-gates 127, 129, 131, 133, respectively, the outputs of which are connected to inputs of an OR-gate 135 whose output is connected to a reset input 137 of the flip-flop 109. So, this reset input 137 is also zero and, from an output 139 of the flip-flop 109, a signal is obtained which is one and is applied to the output 63 from which the signal a is obtained, which is then consequently logic one. Another output 140 of the flip-flop 109 is then zero.

When the signal p becomes zero as the result of a decrease in field strength, the first counter 105 starts counting as it is no longer blocked by the signal at the input 103, which is now one, and as the reset signal at the input 113 has become zero. When the signal p has been zero for a sufficiently long period of time, the outputs 119, 121, 123, 125 of the first counter 105 become one, one after the other, after a sequence of periods of time: $2\tau$, $4\tau$, $8\tau$, $16\tau$, respectively, in which an advantageous value to be selected for $\tau$ may be a value between approximately 10 msec and 100 msec, preferably approximately 50 msec, which may correspond to, for example, four clock pulses.

The AND-gates 127, 129, 131, 133 are operated by a second counter 141, which may assume a position minus one, zero, one or two. In the position minus one outputs 143 and 145 of this counter 141 are logic one, while an output 147 is logic zero. When this counter is in the zero position the outputs 143, 145, 147 are all logic zero; in the one position the output 145 is logic one and the outputs 143 and 147 are logic zero, and in the two position the outputs 145 and 147 are logic one and the output 143 is logic zero.

The output 143 of the second counter 141 is connected to a further input of the AND-gate 127 and to respective inverting inputs of the AND-gates 129, 131 and 133. The outputs 145 and 147 of the second counter 141 are connected to a first and a second input, respectively, of an AND-gate 149, the output of which is connected to a further input of the AND-gate 133, to a first input and to a second inverting input, respectively, of an AND-gate 151, the output of which is connected to a further input of the AND-gate 131, and to an inverting first input and an inverting second input, respectively, of an AND-gate 153, the output of which is connected to a further input of the AND-gate 129.

As a result thereof the output of the AND-gate 127 becomes one when the position of the second counter 141 is minus one and the output 119 of the first counter 105 is one. The output of the AND-gate 129 becomes one when the position of the second counter 141 is zero and the output 121 of the first counter 105 is one. The output of the AND-gate 131 becomes one when the position of the second counter 141 is one and the output 123 of the first counter 105 is one, and the output of the AND-gate 133 becomes one when the position of the second counter 141 is two and the output 125 of the first counter 105 is one. This is the case during a period in said sequence of periods of time $\tau$: $2\tau$, $4\tau$, $8\tau$, $16\tau$, respectively, after the p-signal has become zero.

As a result thereof the output of the OR-gate 135 becomes one during a period in the sequence of periods of time $\tau$: $2\tau$, $4\tau$, $8\tau$, $16\tau$, respectively, depending on the position of the second counter 141, after the p-signal has become zero. The input 107 of the flipflop 109 had already become zero because of the fact that the p-signal has become zero, so that the output 139 of the flip-flop 109 becomes zero during a period in the sequence of periods of time $\tau$: $2\tau$, $4\tau$, $8\tau$, $16\tau$ after the p-signal has become zero. Therefore, the start of a search action is delayed for a period of time which depends on the position of the second counter 141.

When now the signal p becomes one again, the first counter 105 is stopped via its input 103 and reset to zero via its input 113, so that the input 137 of the flip-flop 109 becomes zero and the input 107 becomes one. The output 139 becomes immediately one when the p-signal becomes one and the search action can be stopped without any delay.

When the p-signal remains zero for a period of time shorter than $X\tau$, in which X is determined by the position of the second counter 141, the a-signal at the output 139 of the flip-flop 109 remains one and the search action is not started.

Now the influence of the behavior of the p-signal and, consequently, that of the field strength of a received transmitter on the position of the second counter 141, which, as described hereinbefore, determined the delay in a start of a search action, will be considered.

The second counter 141 has an up-counting input 157, which is connected to an output of an AND-gate 159, an input of which is connected to the output 140 of the flip-flop 109, and a down-counting input 161, which is connected to an output of an AND-gate 163. The output of the AND-gate 159 cannot become logic one and the counting position can therefore not further increase when an inverting input of the AND-gate 159, which is connected to the output of the AND-gate 149, is logic one, that is to say when the highest counting position of the counter 141, two in this case, has been reached. The output of the AND-gate 161 cannot become logic one when the lowest counting position, which in this case is minus one and which causes the output 143 of the counter 141 to be logic one, has been reached, so that the counting position cannot further decrease.

The fact whether the second counter 141 counts upwards or downwards is further determined by a signal coming from an output 165 of a time switch 167, an input 169 of which is connected to the output 139 of the flip-flop 109 via a capacitor 171 and, via a capacitor 173 and a delay circuit 175, to a switch 176 connected to a positive voltage. The input 169 is further connected to ground via a resistor 174. The switch 176 is an on/off switch for the supply voltage of the receiver. The output 165 of the time switch 167 is connected directly to an input of the AND-gate 159 and via an inverter 177 to an input of the AND-gate 163.

The time switch 167 keeps its output 165 in the logic one state for a period of time which may be between half a minute and four minutes, preferably approximately one minute, after a positive edge has occurred at its input 169, i.e. after the a-signal has last become one and the p-signal therefore indicating a field strength decrease of a duration longer than $X\tau$.

The second counter 141 is reset to zero by a signal at a reset input 179 thereof. This signal occurs when a positive voltage is briefly applied to the reset input 179 of the second counter 141 via the switch 176, which is closed as soon as the receiver is switched on, via the delay circuit 175 and via a differentiating network having a capacitor 183 and a resistor 185.

Each time the signal at the output 140 of the flip-flop 109 changes from zero to one within one minute after the time switch 167 started in response to a previous search action, that is to say each new search action carried out within that period of time after a previous search action, so every time the field strength within this minute was insufficient for a period of time longer than $X\tau$, causes the position of the counter 141 to increase by one and the delay in starting a search action may consequently increase. So the delay in starting a search action depends on the duration of the decrease in field strength and on the frequency with which the decreases in the field strength occur.

When no new decrease causing a search action occurs within two minutes after a decrease of the field strength which caused a search action, then the output 165 of the time switch 167 becomes logic zero and the AND-gate 163, which controls the count-down action may become operative via the inverter 177.

Via a differentiating network comprising a capacitor 186 and a resistor 187, a signal coming from an inverter 188, which makes a negative pulse from a positive output pulse of a monostable multivibrator 189, is applied to a further input of the AND-gate 163. The monostable multivibrator 189 is started by a descending edge of an output signal of a second time switch 191. The time switch 191 receives an output signal from an OR-gate 193, an input of which is connected to the output of the inverter 177 via a differentiating network having a capacitor 195 and a resistor 197, another input of this OR-gate 193 being connected to an output of an AND-gate 199, an input of which is connected to the output of the inverter 177 and a further input to the differentiated output of the inverter 188.

The second time switch 191 is started by a positive edge at the output of the differentiating network 195, 197. This positive edge is produced when the signal from the output of the inverter 177 becomes positive. Via the OR-gate 193, this edge is applied to the time switch 191 the output of which then remains logic one for one to ten, preferably approximately two minutes, and which thereafter, when the output becomes logic zero, starts the monostable multivibrator 189 which produces a positive pulse which is converted by means of the inverter 188 into a negative pulse, the positive trailing edge of which reduces the position of the second counter 141 by one and restarts the second time switch 191 via the AND-gate 199 and the OR-gate 193, so that this second time switch applies after every two minutes a pulse to the count-down input 161 of the second counter 141 for the time no interruption occurs in the field strength and the first time switch 167 consequently produces an output signal zero which keeps the relevant inputs of the AND-gates 163 and 199 logic one via the inverter 177. As a result of this the position of the second counter 141 may decrease to its lowest position, causing the AND-gate 163 to be rendered non-conductive again by the signal received from the output 143 of the second counter 141.

When a field strength behavior-dependent delay circuit as described above is used in a car radio the search properties thereof automatically adapt themselves in an advantageous manner to the speed of the car. Namely, it appears that the decreases in field strength have a duration which are substantially inversely proportional to that speed. At a high speed the circuit adjusts itself automatically to a shorter starting-delay time than when the car travels at a low speed.

In the described embodiment only those decreases of the field strength which result in a search action, i.e. decreases in the field strength which have a duration longer than an adjusted start-delay time $X\tau$, influence that start-delay time. This start-delay time is increased when the field strength decreases more than once every minute and is reduced when the field strength does not decrease more than approximately once every two minutes. It will be obvious that although an advantageous adaption for a car radio is obtained by taking the duration as well as the frequency of field strength decreases into consideration in the above described manner, each of these two criteria may alternatively be used individually to adapt the search properties of a receiver to the circumstances in which it is used. Alternatively, if so desired, that adaptation may be obtained with a combination of the rate of occurrence and the duration of the field strength decreases measured independently from one another.

Although the above-described circuit for recognizing the behavior of the field strength signal utilizes the same elements as for delaying the starting signal, this is not an absolute requirement and these two actions may, if so desired, be carried out in separate circuits.

What is claimed is:

1. A receiver having a search tuning circuit for tuning the receiver from a present tuning datum to a next tuning datum from a group of tuning data stored in a memory circuit, said search tuning circuit having means for starting a search action under the influence of a starting signal which depends on the field strength of a received transmitter signal, said starting signal being generated when the field strength of the received transmitter signal becomes too weak, the receiver comprising a start-signal delay circuit having an adjustable time delay for delaying the occurrence of the starting signal in dependence on the behavior of the field strength signal, and further comprising a field strength responsive control circuit for controlling the time delay of the start-signal delay circuit such that the time delay increases to a value above a first existing time delay each time the field strength, within a first fixed time interval after a preceding search action, decreases below a preset level for a period of time greater than the first existing time delay, and such that the time delay decreases to a value below a second existing time delay each time after a second subsequent fixed time interval in which the field strength does not decrease below said preset level for a period of time greater than the second existing time delay.

2. A receiver as claimed in claim 1, characterized in that the time delay of the start-signal delay circuit can be adjusted by the control circuit to a value which is an integral multiple of a reference time delay $\tau$.

* * * * *